United States Patent [19]

Cramer

[11] 3,793,557

[45] Feb. 19, 1974

[54] DIMMER CIRCUIT AND GAPPED CORE INDUCTOR USEFUL THEREWITH

[75] Inventor: Mert Cramer, Los Angeles, Calif.

[73] Assignee: Berkey-Colortran, Inc., Burbank, Calif.

[22] Filed: July 17, 1972

[21] Appl. No.: 272,333

[52] U.S. Cl. .......... 315/199, 307/252 B, 307/252 N, 307/252 T, 315/DIG. 7, 315/311

[51] Int. Cl. .......... H05b 39/04

[58] Field of Search ...... 315/194, 199, 311, DIG. 4, 315/DIG. 7; 307/252 B, 252 N, 252 T

[56] References Cited

UNITED STATES PATENTS

| | | | |
|---|---|---|---|
| 3,588,598 | 6/1971 | Isaacs | 315/199 |
| 3,419,753 | 12/1968 | Schultz et al. | 315/DIG. 4 |
| 3,243,653 | 3/1966 | Locklin | 315/194 |

*Primary Examiner*—Herman Karl Saalbach
*Assistant Examiner*—James B. Mullins
*Attorney, Agent, or Firm*—Flam & Flam

[57] ABSTRACT

In a dimmer circuit a summing amplifier combines a light intensity control voltage with a feedback voltage derived from the thyristor controlled ac power supplied to the lamp load. The summing amplifier output establishes the steepness of a ramp signal produced each ac half cycle by a ramp generator. A trigger circuit fires the thyristor device when the ramp signal reaches a certain level. In the feedback circuit a signal transformer coupled from the load is rectified, shaped by filter networks at the rectifier input and output, and used to charge a capacitor via an isolation amplifier. This capacitor provides a feedback voltage which, when summed with the control voltage, achieves a desired functional relationship between control voltage and light intensity, with compensation for load variation.

A gapped core inductor is series connected with the ac supply to minimize certain adverse effects associated with turn-on of the thyristor device. Thus, use of the inductor reduces lamp filament vibration and minimizes inductive coupling to adjacent audio and other low level circuits. The inductor core includes both small and large air gaps to provide maximum inductance over a wide range of load current.

13 Claims, 9 Drawing Figures

PATENTED FEB 19 1974 3,793,557

DIMMER CIRCUIT AND GAPPED CORE INDUCTOR USEFUL THEREWITH

BACKGROUND OF THE INVENTION

1. Field of the Invention

The present invention relates to a lamp dimmer circuit and to a gapped core inductor useful therewith. The circuit employs a summing amplifier to control the steepness of a ramp signal, generated each ac half cycle, in response to the sum of a light intensity control voltage and a feedback voltage derived by rectifying and shaping a signal transformer coupled from the load.

2. Description of the Prior Art

Dimmer circuits are used to control the light intensity from a lamp in response to a control voltage set by an operator actuated control handle, generally in accordance with the known functions of "linear voltage," "linear light," "square law" etc. In most dimmers a thyristor device such as a triac or a silicon controlled rectifier (SCR) is used to supply ac power from a source to the lamp. A trigger circuit established the thyristor firing angle, thereby controlling power to the lamp and hence setting the light intensity.

Just prior to thyristor turn-on essentially no current is delivered to the load. Immediately after the thyristor device is triggered on, a relatively large current flows. However, the current risetime will depend on the inductance of the load. Thus if the dimmer is used to control a small load, e.g., only one lamp, maximum current will be reached rapidly after the thyristor device is fired. With a heavy load, e.g., many lamps, the current will not reach maximum so rapidly. As a result, if no feedback or load compensation is provided, a given dimmer control handle setting may produce different effective light levels for different loads.

Another problem is the electromagnetic radiation resultant from the steep current transient associated with thyristor turn-on. Each time the triac or SCR is triggered an RF pulse of wide band-width is generated. In television or stage installations, long wires may run between the dimmer and the lamp. These wires may be parallel to microphone cables. The RF pulses caused by the thyristor switching will be picked up by the microphone cable, and cause annoying noises.

To eliminate this interference problem an inductor is placed in series with the ac supplied to the lamp by the thyristor device. This technique is taught by McCabe in U.S. Pat. No. 3,249,805. Indeed one object of the present invention is to provide an improved type of inductor for this purpose. However, the added inductance aggrevates the problem just discussed of maintaining proper relationship between control voltage and lamp intensity independent of load characteristics. Thus a principle object of the present invention is to provide a dimmer control circuit wherein through the use of shaped feedback, the desired control function is achieved over a wide load range.

Certain dimmers employing feedback are known in the past. Thus U.S. Pat. No. 3,588,598 to Anthony Isaacs shows a lighting control system in which a feedback voltage provides one input to a differential amplifier. The other input is the control signal. The difference signal from the amplifier controls the pedestal level of a ramp-and-pedestal type generator producing a signal which establishes the thyristor firing angle. The light control function is fixed by the ramp generator parameters. Another object of the present invention is to provide a dimmer including feedback but wherein ramp-and-pedestal signal generation is not used, and wherein different light control functions may be achieved by selective shaping of the feedback signal.

To achieve optimum interference reduction regardless of load level requires the use of an inductor having a wide dynamic range. An ordinary choke exhibits maximum inductance below a certain current value, and may saturate at higher currents. A swinging choke ameliorates the problem somewhat, but still has a limited dynamic range. A further object of the present invention is to provide a gapped core inductor which exhibits relatively large inductance, and has controlled saturation in several steps over a wide range of current.

SUMMARY OF INVENTION

These and other objects of the invention are achieved by a dimmer wherein a feedback circuit obtains an input signal by transformer coupling from the load. This signal is rectified, shaped and used to charge a capacitor via an isolation amplifier. The voltage across the capacitor comprises a feedback signal which is summed with the light intensity control voltage by a summing amplifier. The summing amplifier output establishes the rate at which a ramp generating capacitor is charged each ac half cycle. When the resultant ramp signal reaches a certain value, a trigger circuit provides a firing signal to thyristor device providing power to the lamp load. Compensation for load variation and inductive effects is achieved. Use of appropriate feedback shaping networks permits selection of lamp intensity function. A gapped core inductor in series with the thyristor device and load minimizes radiative interference from the dimmer.

BRIEF DESCRIPTION OF THE DRAWINGS

A detailed description of the invention will be made with reference to the accompanying drawings wherein like numerals designate corresponding elements in the several figures.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention since the scope of the invention best is defined by the appended claims.

Figure 1:
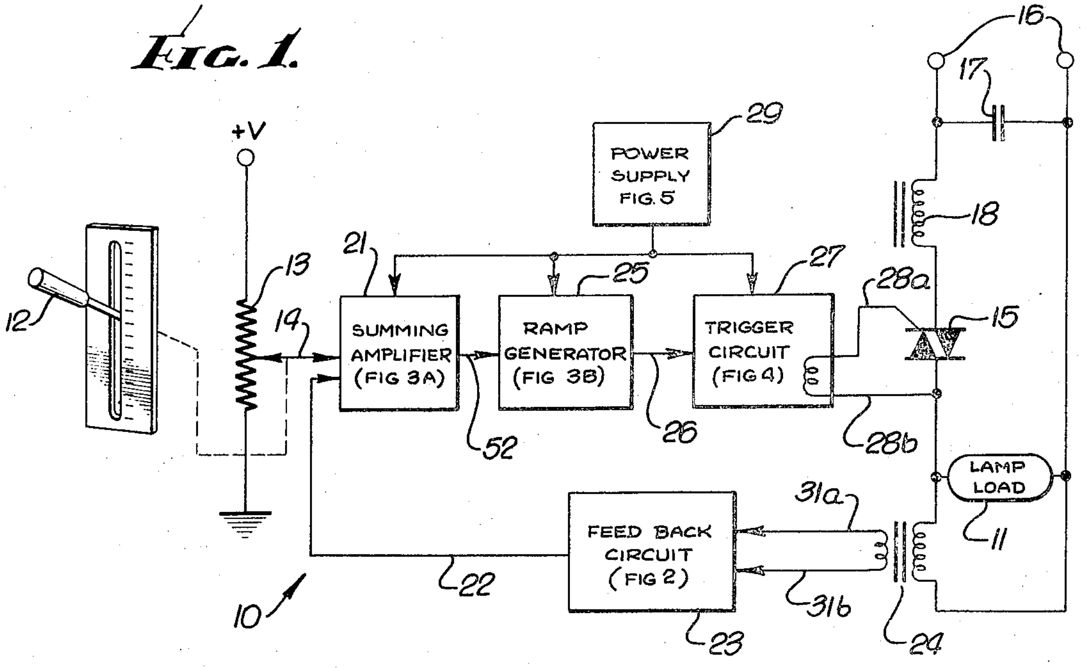
FIG. 1 shows diagrammatically a dimmer circuit in accordance with the present invention.

Referring to FIG. 1, the inventive dimmer circuit 10 functions to control the light intensity from one or more lamps comprising a load 11 as a function of the position of a dimmer control handle 12. The control handle 12 is mechanically linked to a potentiometer 13 so as to provide on a line 14 a light intensity control voltage $e_c$ linearly related to the position of the handle 12. In response to this control voltage, the circuit 10 establishes the firing angle of a triac 15 or like thyristor device supplying ac power to the load 11. This ac power is provided via the terminals 16, a capacitor 17 and an inductor 18 which reduces spurious radiation otherwise associated with the rapid switching of power by the triac 15. Advantageously the inductor 18 is of the gapped core type discussed below in conjunction with FIGS. 6, 7 and 8.

The dimmer 10 includes a summing amplifier 21 which sums the control voltage $e_c$ with a feedback voltage $e_f$ provided via a line 22 from a feedback circuit 23. This feedback voltage is derived from a signal coupled from the load 11 by a transformer 24. The magnitude of the feedback voltage $e_f$ generally is related to the firing angle of the triac 15, but is modified by filter networks in the feedback circuit 23 so as to produce the desired functional relationship between the control voltage $e_c$ and the light intensity from the lamp 11.

A ramp generator 25 produces on a line 26 a ramp signal in synchronism with each ac half cycle. The ramp angle or steepness of the ramp signal is established by the output of the summing amplifier 21, and thus is related to the sum of the voltages $e_c$ and $e_f$. When the ramp signal reaches a certain level, a trigger circuit 27 supplies a thyristor firing signal via the lines 28*a*, 28*b* to the gate or control element of the triac 15. In this manner the position of the control handle 12 establishes the firing angle of the triac 15 and hence the light intensity from the lamp 11. A power supply 29 provides the necessary operating voltages for the dimmer 10.

Figure 2:
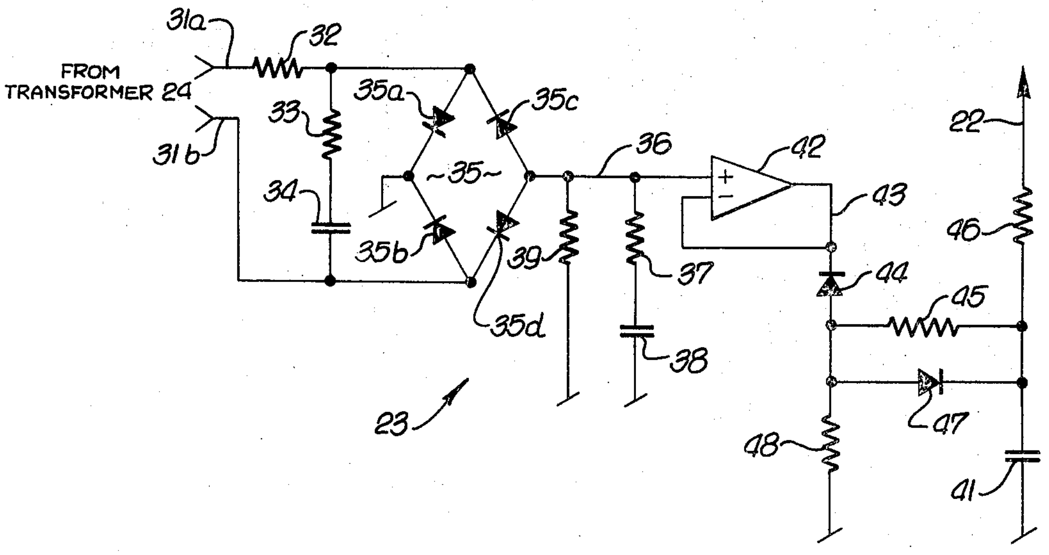
FIG. 2 is an electrical schematic diagram of the feedback circuit of FIG. 1.

A preferred embodiment of the feedback circuit 23 is shown in FIG. 2. The signal supplied via the lines 31*a*, 31*b* from the transformer 24 is provided via a resistor 32 to a shaping network comprising a series connected resistor 33 and capacitor 34. This network establishes the basic character of the desired transfer function when the dimmer 10 is used to drive a heavy load such as multiple lamps 11.

The shaped feedback signal is rectified by a bridge rectifier 35 comprising four diodes 35*a* – 35*d*. The output on the line 36 is a negative dc signal which drops toward neutral each ac half cycle, but which has a mean voltage generally related to the firing angle of the triac 15. The bridge 35 output is shaped by a filter network comprising a resistor 37 and a capacitor 38 which further compensate for load variations. A resistor 39 of large value aids circuit stability.

The feedback voltage $e_f$ corresponds to the voltage across a capacitor 41 (FIG. 2) which is charged to a level established by the signal on the line 36. To prevent loading of the bridge 35, the capacitor 41 is charged via an isolation amplifier 42 which may comprise an operational amplifier such as the type 741 manufactured by General Electric. The line 36 is connected to the non-inverting (+) input of the amplifier 42 so that the output on a line 43 is of the same polarity and directly proportional in amplitude to the signal on the line 36. Voltage from the amplifier 42 charges the capacitor 41 via a diode 44 and resistor 45. The capacitor 41 is connected to the line 22 via a resistor 46.

A discharge path for the capacitor 41 is provided via a diode 47 and a resistor 48. The discharge time constant set by the values of the capacitor 41 and the resistor 48 preferably corresponds to several (typically 5 to 10) ac cycles. As a result, while the dimmer control handle 12 is at a fixed setting, the charge on the capacitor 41 remains substantially constant. As the control handle 12 is moved in a direction reducing the light intensity from the lamp 11, the magnitude of the voltage on the line 36 will decrease. The capacitor 41 then will discharge via the diode 47 and the resistor 48. Thus over a duration of several cycles the charge on the capacitor 41 and hence the feedback voltage $e_f$ will decrease to a new value established by the rectified and shaped signal on the line 36. The relatively slow discharge time aids in preventing abrupt changes in light intensity from the lamp 11.

Figure 3A:
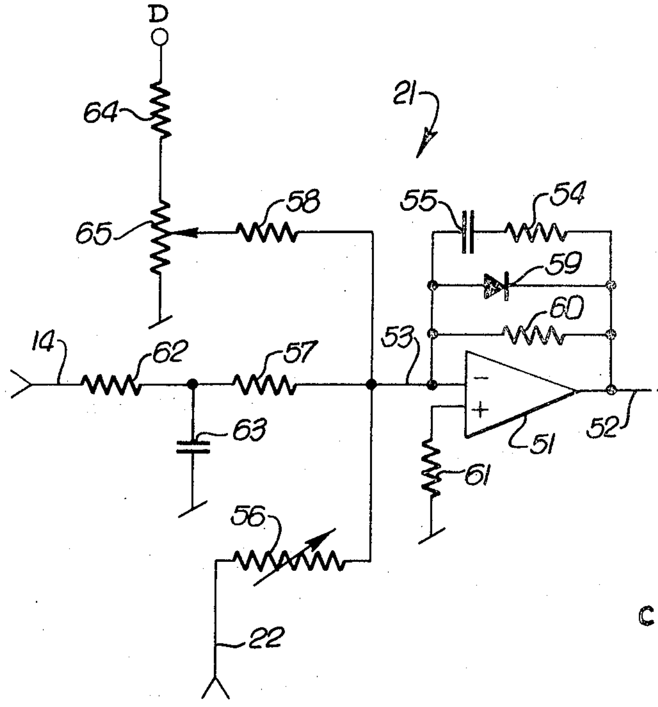
FIGS. 3A and 3B are electrical schematic diagrams of the summing amplifier and ramp generator of FIG. 1.

The summing amplifier 21 (FIG. 3A) comprises a high gain operational amplifier 51 having an output line 52 connected back to the inverting (−) amplifier input 53 via a feedback resistor 54 and a bypass capacitor 55. The input 53 (the summing point) receives the voltages to be summed via respective resistors 56, 57, 58. By selecting the values of each resistor 56, 57, 58 to be much greater than the value of the feedback resistor 54 divided by the gain of the amplifier 51, the output on the line 52 will correspond to the sum of the input voltages. A diode 59 and a resistor 60 of high value (typically 800 k ohm) are connected across the amplifier 51 for circuit stability. The non-inverting (+) input of the amplifier 51 is connected via a resistor 61 to the power supply neutral. The amplifier 51 also may be a compensated operational amplifier such as a type 741.

Three voltages are provided to the summing amplifier 21. The feedback voltage $e_f$ on the line 22 is connected via the resistor 56. The control voltage $e_c$ from the line 14 is connected to the resistor 57 via a resistor 62 and a relatively large capacitor 63 (typically 2.2 mfd). The capacitor 63 prevents the control voltage $e_c$ from changing abruptly should the control handle 12 be moved rapidly. Thus the capacitor 63, together with the slow discharge circuit for the capacitor 41, prevent abrupt changes in light intensity. The third input to the summing amplifier 21 is a constant bias voltage provided via a resistor 64 and a potentiometer 65 the setting of which is fixed during normal dimmer operation. The purpose of the bias voltage is to establish a minimum output level from the summing amplifier 21 to optimize operation of the ramp generator 25. Accordingly, the output on the line 52 is a negative voltage indicative of the sum of the control voltage $e_c$, the feedback voltage $e_f$ and a fixed bias voltage.

Figure 3B:
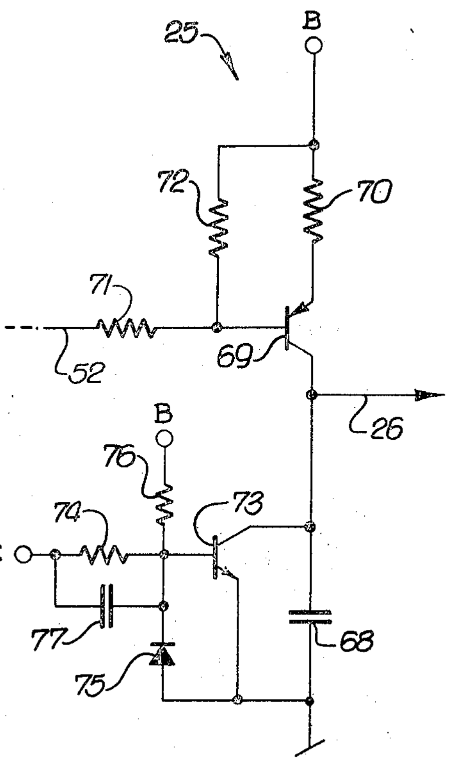

In the embodiment of FIG. 3B the ramp generator 25 comprises a capacitor 68 which is discharged at the beginning of each ac half cycle. The capacitor 68 then is charged via a transistor 69 and a resistor 70 at a rate established by the summing amplifier 21 output. To this end, signal on the line 52 is supplied to the transistor 69 base via a resistor 71. Bias is provided via a resistor 72.

When the control handle 12 is set to provide a relatively large control voltage $e_c$, the summing amplifier 21 will have a correspondingly high negative output causing relatively heavy conduction of the transistor 69. The capacitor 68 will charge rapidly producing a ramp signal on the line 26 having a steep ramp angle and fast risetime. With the control handle 12 set to provide a lower control voltage $e_c$, the signal on the line 52 will be less negative. This will decrease current flow through the transistor 69 so that the capacitor 68 takes more time to charge. The resultant ramp signal will have a less steep ramp angle or slower risetime.

The capacitor 68 is shunted by a transistor 73. To permit the capacitor 68 to charge, the transistor 73 is biased off during most of each ac half cycle. This is achieved by providing a negative voltage from the power supply terminal C to the transistor 73 base via a resistor 74, and clamping the base to the emitter via a diode 75.

At the beginning of each ac half cycle the voltage at the terminal C abruptly drops to zero. The transistor 73 base then is driven positive by a voltage supplied via a resistor 76, with fast transient response insured by a capacitor 77. As a result, transistor 73 is pulsed into conduction, rapidly discharging the capacitor 68.

Figure 4:
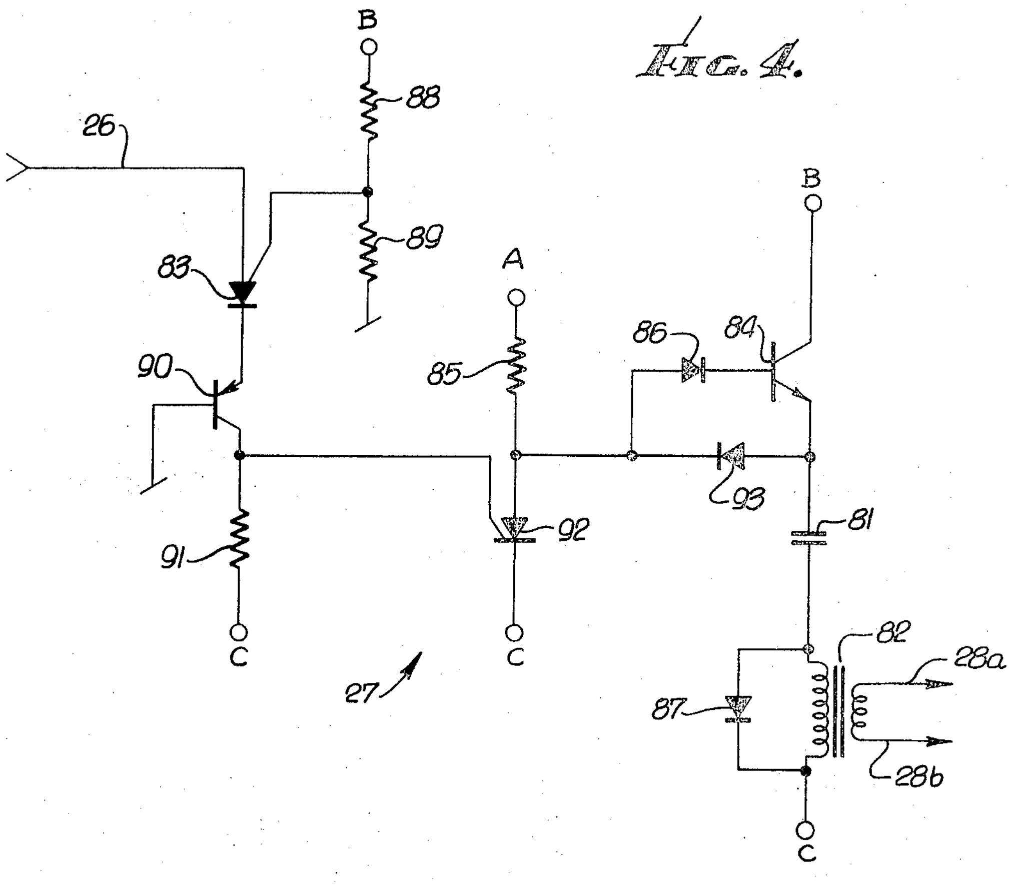
FIG. 4 is an electrical schematic diagram of the trigger circuit of FIG. 1.

The trigger circuit 27 (FIG. 4) provides a firing pulse to the triac 15 as soon as the ramp signal on the line 26 reaches a certain level. To this end, the circuit 27 includes a precharged capacitor 81 which is caused to discharge abruptly through the primary of a transformer 82 when the ramp signal on the line 26 reaches a level sufficient to cause conduction of a programmable unijunction transistor 83. The signal induced in the secondary of the transformer 82 is supplied via the lines 28*a*, 28*b* to the triac 15 gate.

The capacitor 81 is precharged via a transistor 84 which conducts for the portion of each ac half cycle prior to triac firing. In this interval the transistor 84 base receives a positive voltage from the power supply terminal A via a resistor 85 and diode 86. The charge path is from the power supply terminal B through the transistor 84, the capacitor 81 and a diode 87 shunting the transformer 82 primary to the power supply terminal C.

The ramp level at which the capacitor 81 is discharged to trigger the triac 15 is established by the gate control voltage provided to the unijunction transistor 83 by a voltage divider comprising a pair of resistors 88, 89. As soon as the ramp signal on the line 26 reaches this level, the unijunction transistor 83 conducts to cause current flow through a transistor 90 and a resistor 91. This current gates on a silicon controlled rectifier (SCR) 92 which clamps the junction of the resistor 85 and the diode 86 to the negative potential of the power supply terminal C. As a result, the capacitor 81 discharges through a path including the transformer 82 primary, the SCR 92 and a diode 93.

In this manner, the triac 15 is triggered on at a firing angle established by the setting of the control handle 12, modified by feedback supplied via the circuit 23. Appropriate selection of the feedback network components 33, 34, 37, 38 (FIG. 2) establish the relationship between the dimmer control handle 12 setting and the intensity of the lamp load 11. By way of example, a "linear voltage" relationship between the control voltage $e_c$ and the RMS voltage supplied to the load 11 can be achieved with the following component values:

| | |
|---|---|
| Resistor 33 | 6.52 k ohms |
| Capacitor 34 | 1 mfd |
| Resistor 37 | 17.8 k ohms |
| Capacitor 38 | 0.047 mfd |

Figure 5:
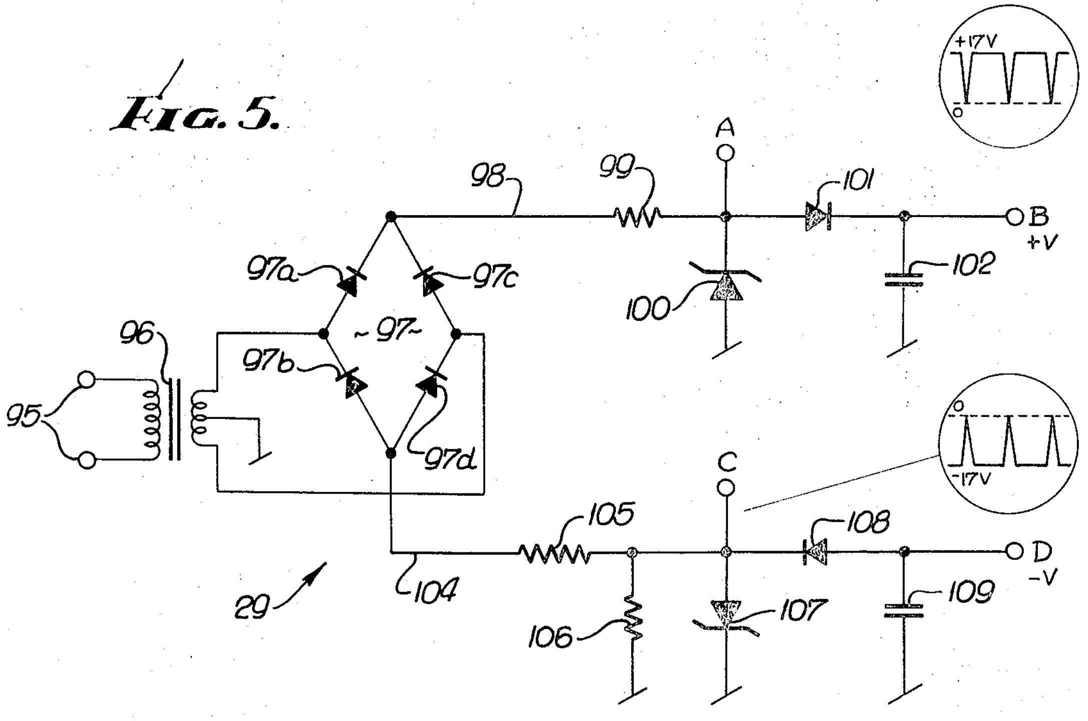
FIG. 5 is an electrical schematic diagram of the power supply of FIG. 1.

A power supply 29 for the dimmer 10 is shown in FIG. 5. AC voltage is connected via the terminals 95 and a transformer 96 having a grounded center tap secondary to a bridge rectifier 97 comprising four diodes 97*a* – 97*d*. The positive bridge output 98 is connected via a resistor 99 to a Zener diode 100 and to the terminal A. The terminal A signal is a positive voltage having a maximum value established by the Zener diode 100 and dropping abruptly to zero in unison with the ac zero crossings. The voltage from the resistor 99 also is fed via a diode 101 and a filter capacitor 102 to the filtered positive voltage terminal B.

The power supply 29 also provides at the terminal C a negative voltage dropping to zero at each ac zero crossing, and at the terminal D a filtered negative voltage. To this end, the negative bridge output 104 is connected to the terminal C via a pair of resistors 105, 106 and a Zener diode 107. A diode 108 and a capacitor 109 lead to the terminal D.

Figure 6:
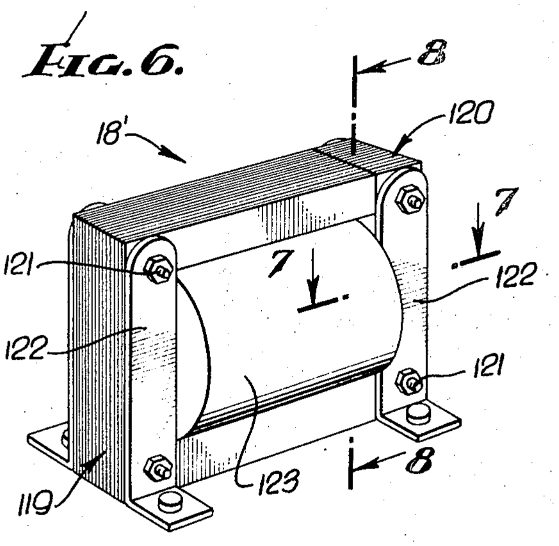
FIG. 6 is a pictorial view of a gapped core inductor useful with the dimmer circuit of FIG. 1.
Figure 7:
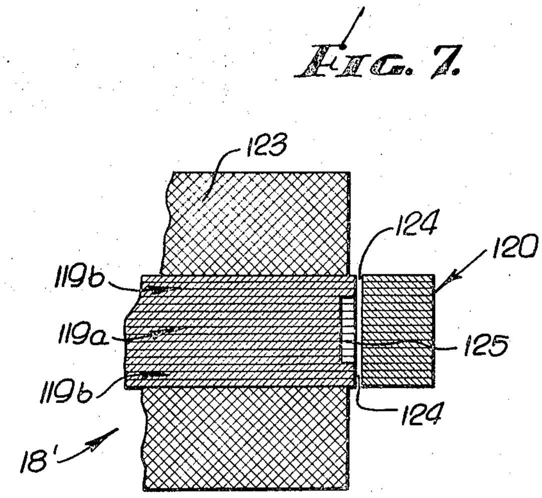
FIG. 7 is a fragmentary sectional view of the inductor of FIG. 6 as seen along the line 7—7 thereof.
Figure 8:
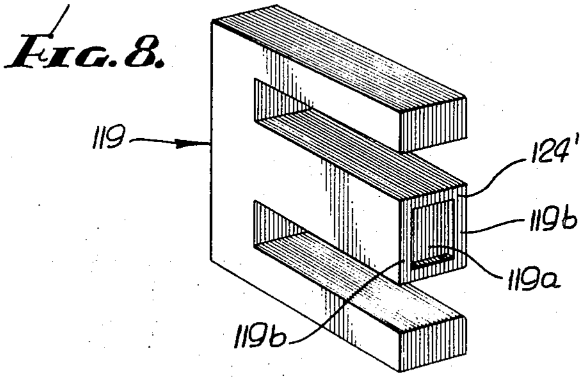
FIG. 8 is a fragmentary perspective view of the inductor of FIG. 6, cut-off and shown in section along the line 8—8 thereof.

Referring now to FIGS. 6 and 7, there is shown a gapped core inductor 18' useful as the inductor 18 in the circuit of FIG. 1. The inductor 18' core includes E-shaped laminations 119 and I-shaped laminations 120 fastened by bolts 121 which also engage mounting brackets 122. A coil 123 surrounds the central leg of the laminations 119.

The inductor 18' is characterized by different sized air gaps 124, 125 between the laminations 119 and 120. To form the gap 125, the central laminations 119*a* are notched at the end of the central leg. The surface 124' (FIG. 8) defining the gap 124 is defined by the notch border portions of the laminations 119*a* and by the unnotched laminations 119*b*.

With relatively low dc current flowing through the coil 123, the resultant magnetic flux path is confined principally to the narrow gaps 124. At higher dc current levels the flux path links the large gap 125 which typically is 0.007 inches across. The gapped core inductor 18' does not tend to saturate as the current is increased; considerable inductance is exhibited over a wide current range. Thus the inductor 18' is effective in shaping the current transients through the triac 15 (FIG. 1), and hence in reducing radiative interference from the dimmer circuit 10, over a wide range of lamp loads.

The particular gap sizes used in the inductor cause the core to saturate in stages of increasing current. Proper selection of the gap structure can result in a rise time for the load which is linear with time. This condition will occur only at one load value. Usually the condition of maximum linearity of the rise time coincides with maximum load power. This minimizes the effects of *di/dt* in adjacent wiring.

Intending to claim all new, useful and unobvious features of the invention, the applicant claims:

1. In a dimmer circuit of the type wherein the light intensity from a lamp is adjusted by controlling the firing angle of one or more thyristor devices supplying ac power to a load comprising said lamp, a circuit for controlling the firing angle of said elements in response to a light intensity control voltage linearly related to the position of an operator actuated dimmer control handle, comprising:

a feedback circuit for providing a feedback voltage indicative of the power supplied to said load by said thyristor device, said feedback circuit comprising;

means providing a feedback input signal derived from the power supplied to said load by said thyristor device, bridge rectifier means for rectifying said derived feedback input signal, a first resistor-capacitor network across the input of said bridge rectifier means, a second resistor-capacitor network across the output of said bridge rectifier means, said first and second networks providing load variation compensation, an isolation amplifier, a capacitor, and means for charging said capacitor via said isolation amplifier to a level established by the output of said bridge rectifier means, the voltage across said capacitor comprising said feedback voltage, a summing amplifier for combining said control voltage and said feedback voltage to provide an output indicative of the sum thereof, ramp generator means for producing a ramp voltage having a ramp angle established by said summing amplifier output, and trigger means for firing said thyristor device when said ramp voltage exceeds a certain value.

2. A circuit according to claim 1 wherein the component values of said networks are selected to provide linear relationship between control voltage and RMS voltage to said lamp.

3. A circuit according to claim 1 further including a gapped core inductor in series with the supply to said load, said inductor having a magnetic flux path including at least two air gaps of different size, said inductor reducing radiative interference associated with thyristor device turn-on, said networks also compensating for control function variation introduced by said inductor.

4. A circuit according to claim 1 together with means for discharging said capacitor over several cycles of said ac power when said feedback input signal decreases in response to reduction of said control voltage.

5. A circuit according to claim 1 wherein said ramp generator means comprises:

a ramp capacitor, means for discharging said capacitor at the beginning of each half cycle of said source ac, and transistor means for providing charging current to said ramp capacitor, the amount of said current being established by said summing amplifier output.

6. A circuit for controlling the power provided from an ac source to a load via a thyristor in response to a control voltage, comprising:

a feedback circuit coupled to said load and including:

rectifier means for rectifying a signal coupled from said load, a first filter network connected to the input of said rectifier means for shaping said coupled signal and a second filter network connected to the output of said rectifier means for shaping said rectified signal, a capacitor, an isolation amplifier, and means for charging said capacitor via said isolation amplifier to a level established by said rectified signal, the voltage across said capacitor comprising a feedback voltage, a summing amplifier for summing said control voltage and said feedback voltage, a ramp generator providing a signal having a ramp angle established by the output of said summing amplifier, and a trigger circuit for firing said thyristor when said ramp signal reaches a certain value.

7. A circuit according to claim 6 wherein said feedback circuit includes means for discharging said capacitor with a discharge time constant corresponding to several cycles of said ac source.

8. A dimmer circuit according to claim 7 together with a capacitor of large value connected to prevent abrupt changes in said control voltage.

9. A circuit according to claim 6 wherein said means for rectifying comprises a bridge rectifier, wherein said first network comprises a resistor and capacitor series connected across said bridge input, and wherein said second filter network comprises a resistor and capacitor series connected across said bridge output.

10. A dimmer circuit according to claim 9 wherein the values of said filter network components are selected to achieve a linear function between control voltage and RMS voltage supplied to said load.

11. A dimmer circuit according to claim 6 wherein said ramp generator comprises:

a ramp capacitor, a transistor connected in the charging path to said capacitor, means connecting the output of said summing amplifier to the base of said transistor to control the charging current to said capacitor in response to said output, and means for rapidly discharging said capacitor at the beginning of each ac half cycle comprising;

a second transistor connected across said ramp capacitor, and means for clamping off said second transistor during each ac half cycle and for gating on said transistor in unison with the zero crossings of said ac source.

12. A dimmer circuit according to claim 6, together with a gapped core inductor in series with said ac source, said thyristor device and said load, said inductor having a magnetic flux path including at least two air gaps of different size.

13. In combination, a dimmer circuit of the type wherein the light intensity from a lamp is controlled by adjusting the firing angle of a thyristor device supplying ac power from a source to said load, and a gapped core inductor in series with said thyristor device and said load to reduce electromagnetic radiation resultant from the current transient as said thyristor device is triggered on, said gapped core inductor comprising:

a lamination assembly including a central portion, a coil surrounding said central portion, and at least two air gaps of different size in the magnetic flux path including said central portion.

* * * * *